United States Patent
Lee et al.

(10) Patent No.: US 11,776,858 B2
(45) Date of Patent: Oct. 3, 2023

(54) PLASMA APPARATUS AND METHODS OF MANUFACTURING SEMICONDUCTOR DEVICE USING THE SAME

(71) Applicant: Samsung Electronics Co., Ltd., Suwon-si (KR)

(72) Inventors: Joonsung Lee, Hwaseong-si (KR); Suhong Kim, Yongin-si (KR); Youngwon Shin, Hwaseong-si (KR); Hyungchul Cho, Suwon-si (KR); Jaehyoung Lee, Gimpo-si (KR); Hyunjae Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 475 days.

(21) Appl. No.: 16/798,575

(22) Filed: Feb. 24, 2020

(65) Prior Publication Data
US 2020/0402866 A1   Dec. 24, 2020

(30) Foreign Application Priority Data

Jun. 21, 2019   (KR) .......................... 10-2019-0074372

(51) Int. Cl.
| | |
|---|---|
| *H01L 21/66* | (2006.01) |
| *H01L 21/67* | (2006.01) |
| *H01J 37/305* | (2006.01) |
| *H01L 21/3065* | (2006.01) |
| *H01J 37/32* | (2006.01) |

(52) U.S. Cl.
CPC .......... *H01L 22/20* (2013.01); *H01J 37/3053* (2013.01); *H01J 37/32449* (2013.01); *H01L 21/3065* (2013.01); *H01L 21/67069* (2013.01); *H01L 21/67253* (2013.01)

(58) Field of Classification Search
CPC ................ H01L 22/20; H01L 21/3065; H01L 21/67069; H01L 21/67253; H01J 37/32449; H01J 37/3035
See application file for complete search history.

(56) References Cited

U.S. PATENT DOCUMENTS

| | | | |
|---|---|---|---|
| 7,648,578 B1 * | 1/2010 | Itatani | ............... C23C 16/45546 438/778 |
| 7,987,814 B2 | 8/2011 | Carducci et al. | |
| 8,313,578 B2 | 11/2012 | Carducci et al. | |
| 9,443,753 B2 | 9/2016 | Palagashvili et al. | |
| 2004/0092120 A1 | 5/2004 | Wicker | |

(Continued)

FOREIGN PATENT DOCUMENTS

| | | | | |
|---|---|---|---|---|
| CN | 203675494 U | * | 6/2014 | ............ F16F 9/0481 |
| EP | 821395 A2 | * | 1/1998 | .......... H01J 37/3244 |

(Continued)

*Primary Examiner* — Mohammad M Choudhry
(74) *Attorney, Agent, or Firm* — HARNESS, DICKEY & PIERCE, P.L.C.

(57) ABSTRACT

A method of manufacturing a semiconductor device includes preparing etched mapping data by measuring an etching amount of a wafer subjected to an etching process, determining an error region in which the etching amount of the wafer is outside of a reference value, based on the etched mapping data, compensating distribution of an electrical field applied to the wafer, and compensating exhaust distribution of a process gas, changed by the compensating distribution of an electrical field.

20 Claims, 9 Drawing Sheets

(56) References Cited

U.S. PATENT DOCUMENTS

2010/0081284 A1    4/2010   Balakrishna et al.
2015/0279633 A1   10/2015   Carducci et al.
2018/0061615 A1    3/2018   Kim et al.

FOREIGN PATENT DOCUMENTS

| KR | 10-1361757 B1 | 2/2014 | | |
| KR | 10-1449548 B1 | 10/2014 | | |
| KR | 10-1909478 B1 | 10/2018 | | |
| WO | WO-2009/054696 A1 | 4/2009 | | |
| WO | WO 2021/034508 | * | 8/2019 | ........... C23C 16/458 |

* cited by examiner

PLASMA APPARATUS AND METHODS OF MANUFACTURING SEMICONDUCTOR DEVICE USING THE SAME

CROSS-REFERENCE TO RELATED APPLICATION(S)

This application claims benefit of priority to Korean Patent Application No. 10-2019-0074372 filed on Jun. 21, 2019 in the Korean Intellectual Property Office, the disclosure of which is incorporated herein by reference in its entirety.

BACKGROUND

1. Field

The present inventive concept relates to a plasma processing device and a method of manufacturing a semiconductor device using the same.

2. Description of Related Art

In general, a semiconductor device is manufactured through a plurality of unit processes including a thin film deposition process, and a dry or wet etching process. There among, the dry etching process is performed in a chamber in which plasma reaction is mainly induced by an electrical field. With the miniaturization and high integration of semiconductor devices, the influence of a nonuniform dry etching process on the characteristics of semiconductor devices is increasing.

SUMMARY

An aspect of the present inventive concept is to provide a plasma processing device capable of reducing etching nonuniformity on a wafer processed in a plasma processing process and a method of manufacturing a semiconductor device.

According to an aspect of the present inventive concept, a method of manufacturing a semiconductor device includes: placing a test wafer on a lower electrode inside a process chamber, the lower electrode encircled by a gas exhaust plate, the gas exhaust plate having a plurality of openings, etching the test wafer in the process chamber by applying an electrical field to a process gas to produce plasma, preparing etched mapping data by measuring an etched amount of a test wafer subjected to an etching process, determining an error region in which the etching amount of the wafer is outside of a reference value, the reference value being based on the etched mapping data, compensating the distribution of an electrical field, applied to the wafer, by adjusting at least one by adjusting at least one of a size of an upper cross-section of an adjacent opening, in a region adjacent to the error region, a size of an upper cross-section of the plurality of openings, and a size of an upper cross-section an area of a region in which the gas exhaust plate is connected to the side wall, and compensating exhaust distribution of a process gas, changed by the compensating distribution of an electrical field, by adjusting a size of a lower cross-section of the at least one opening.

According to an aspect of the present inventive concept, a method of manufacturing a semiconductor device includes: placing a test wafer on a lower electrode inside a process chamber, the lower electrode encircled by a gas exhaust plate, the gas exhaust plate having a plurality of openings, etching the test wafer in the process chamber by applying an electrical field to a process gas to produce plasma, preparing etched mapping data by measuring an etched amount from a test wafer subjected to the etching process, in a plasma processing device, determining an error region in which the etched amount of the test wafer is outside of a reference value, the reference value being based on the etched mapping data, increasing or reducing the electrical conductivity of an electrical field applied to the error region by adjusting at least one of a size of an upper cross-section of an adjacent opening, in a region adjacent to the error region, a size of an upper cross-section of the plurality of openings, and a size of an upper cross-section an area of a region in which the gas exhaust plate is connected to the side wall, and changing exhaust distribution of the process gas exhausted through the gas exhaust passage by adjusting a size of a lower cross-section of the adjacent opening.

According to an aspect of the present inventive concept, a plasma processing device includes: a process chamber having a side wall and in which a process of etching a wafer by generating plasma with a process gas supplied to the process chamber is performed, an upper electrode in an upper portion of the process chamber, a lower electrode in a lower portion to the upper electrode and having a mounting region on which the wafer is mounted, a gas exhaust passage between the side wall and the lower electrode to exhaust the process gas, and a gas exhaust plate having a plurality of openings through which the process gas is exhausted and at least one region of a perimeter of the gas exhaust plate to selectively be in contact with the sidewall to limit flow of the process gas around the lower electrode.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, the example embodiments of the present disclosure will be described in detail with reference to the attached drawings.

Figure 1:
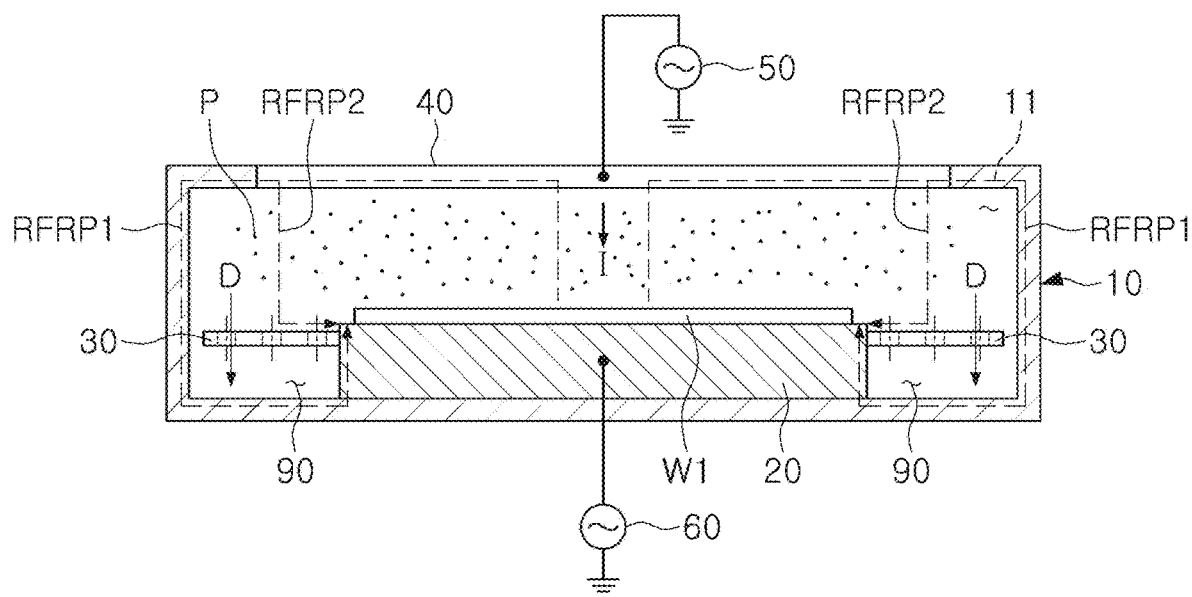
FIG. 1 is a side view of a plasma processing device according to an embodiment of the present disclosure.

FIG. 1 is a side view of a plasma processing device 1 according to an embodiment of the present disclosure.

Figure 2:
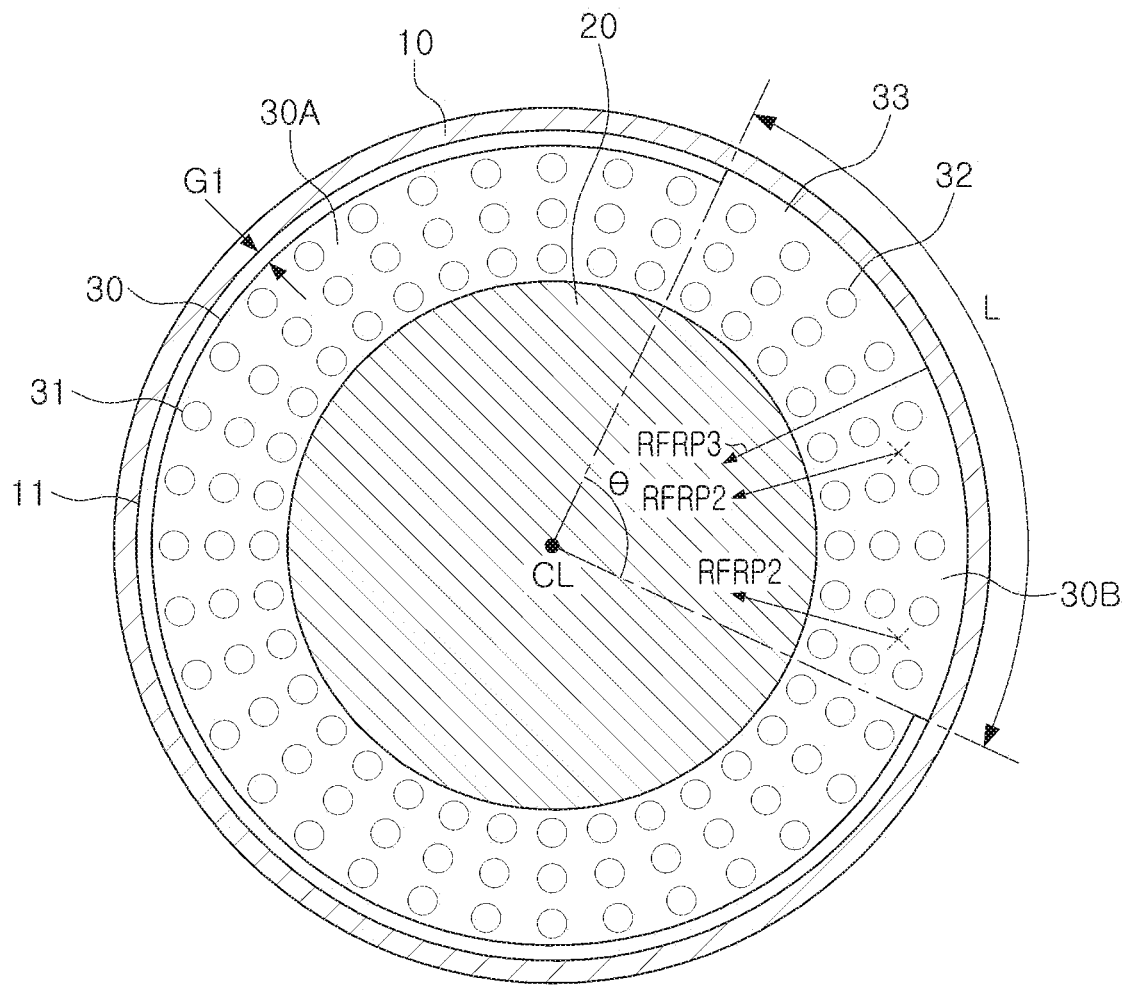
FIG. 2 is a plan view of a plasma processing device while a wafer is removed therefrom viewed in direction I of FIG. 1.
Figure 3A:
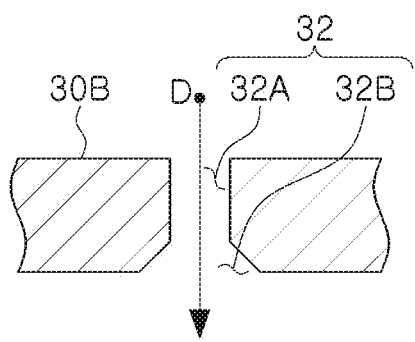
FIG. 3A is a cross-sectional view of an opening of FIG. 1.
Figure 3B:
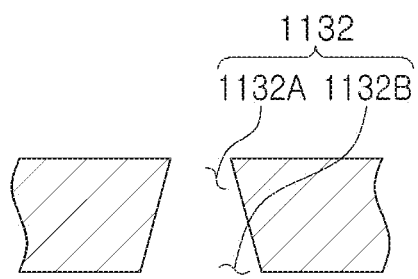
FIGS. 3B and 3C illustrate a modified example of an opening of FIG. 3A.
Figure 3C:
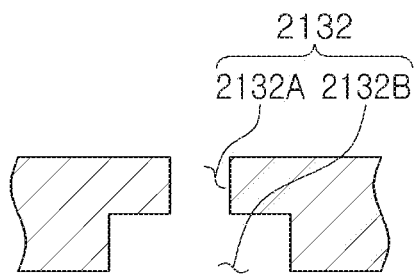

FIG. 2 is a plan view of a plasma processing device while a wafer is removed therefrom viewed in direction I of FIG. 1, and FIG. 3A is a cross-sectional view of an opening of FIG. 1. FIGS. 3B and 3C illustrate a modified example of an opening of FIG. 3A.

Referring to FIG. 1, the plasma processing device 1 may include a process chamber 10, an upper electrode 40 in the upper portion of the process chamber 10, a lower electrode 20 in the lower portion of the process chamber 10 and supporting a wafer W1, a gas exhaust passage 90 formed between a sidewall 11 of the process chamber and the lower electrode 20, and a gas exhaust plate 30 in the gas exhaust passage 90. The wafer W1 may be a semiconductor substrate having an etching layer, and the plasma processing device 1 may be a device for etching an etching layer on a semiconductor substrate.

The process chamber 10 may be used to perform a plasma process on the wafer W1 by generating plasma P in a process gas. The process chamber 10 may have sidewall 11 formed of a material with excellent wear resistance and excellent corrosion resistance. The process chamber 10 may be maintained in a sealed state or a vacuum state during the plasma process, for example, an etching process.

Referring to FIGS. 1 and 2, the lower electrode 20 may support the wafer W1 at a mounting region. For example, the lower electrode 20 may be an electrostatic chuck. That is, the wafer W1 may be mounted on the lower electrode 20 due to an electrostatic force formed on an upper portion of the lower electrode 20. The lower electrode 20 may have a shape similar to that of the wafer W1. For example, an upper surface of the lower electrode 20 may be circular having a concentric axis CL, and a common center with the wafer.

The upper electrode 40 may be in an upper portion of the process chamber 10 opposite the lower electrode 20. The upper electrode 40 may supply the process gas into the process chamber. For example, the upper electrode 40 may be a shower head distributing the process gas into the process chamber 10. The shower head may also spray the process gas onto a surface of the wafer W1.

The wafer W1 for an etching test may be mounted on the lower electrode 20, and a gas exhaust passage 90, to which the process gas is exhausted, may be formed to have a constant width around the lower electrode 20. The process gas may be exhausted in a lower direction D of the process chamber 10 through the gas exhaust passage 90.

The upper electrode 70 may receive power from a first power source 50, and the lower electrode 20 may receive power from a second power source 60. The first power source 50 and the second power source 60 may be opposing terminals in a circuit. The upper electrode 70 and the lower electrode 20 may be synchronized to form an electrical field. Through such an electrical field, the process gas, supplied to the process chamber 10, may be excited to a plasma P.

Referring to FIGS. 1 and 2, the gas exhaust plate 30 encircles the lower electrode 20, and may limit flow of the process gas exhausted to the gas exhaust passage 90. In addition, the gas exhaust plate 30 may be used to control distribution of an electrical field applied to the wafer W1. The gas exhaust plate 30 has a replaceable structure, and a form of the gas exhaust plate is changed to control flow of a process gas and distribution of an electrical field to prevent etching nonuniformity of the wafer W1.

The gas exhaust plate 30 may be a plate having a ring shape around the lower electrode 20. A central opening H, in contact with the lower electrode 20, may be provided at the center of the gas exhaust plate 30. The central opening H is located at the center of the central opening in the concentric axis CL, and may be formed to have a common center with the wafer W1. A plurality of openings 31 and 32 may be formed around the central opening H. In an embodiment, it is illustrated that the plurality of openings 31 and 32 are arranged radially around the concentric axis CL, but an embodiment is not limited thereto. Alternatively, the plurality of openings 31 and 32 may be variously arranged such as in a matrix array or an alternating array. The plurality of openings 31 and 32 may be formed to pass gas through the gas exhaust plate 30 in a direction D to control the flow of the process gas exhausted to the gas exhaust passage 90. By changing the arrangement or shape of the plurality of openings 31 and 32 the process gas exhausted through the gas exhaust passage 90 may be controlled.

The gas exhaust plate 30 may be provided with a connection portion 33. An outer edge of the connection portion 33 may be in contact with the sidewall 11 in one region. The connection portion 33 may be in an etching compensated region θ, a region of the wafer W1 over which the electrical conductivity of the electrical field is to be adjusted. The etching compensated region θ may be defined as a region within a predetermined angle range in the concentric axis CL of the lower electrode 20.

The gas exhaust plate 30 may include a first region 30A, not corresponding to the etching compensated region θ, and a second region 30B, corresponding to the etching compensated region θ. The opening 32 in the second region 30B of the plurality of openings 31 and 32 is hereafter defined as adjacent opening 32. The first region 30A may be spaced apart from the sidewall 11 by a predetermined distance to form a gap G1. The gas exhaust plate 30 may be formed of a conductive material with excellent electrical conductivity. In an embodiment, the gas exhaust plate 30 may be formed of aluminum (Al). An aluminum anodizing film may be further formed on a surface of the gas exhaust plate 30. Thus, the gas exhaust plate 30 may be electrically connected to the lower electrode 20 to form a ground path.

By adjusting an arc L of the connection portion 33 of the gas exhaust plate 30 distribution of the electrical conductivity of the electrical field, applied to the wafer W1 may be adjusted. The connection portion 33 is in contact with the sidewall 11 to form a ground path, thereby increasing the electrical conductivity of the connected region. When the electrical conductivity is increased, impedance is reduced, so the strength of the applied electrical field is reduced. Accordingly, the amount of plasma formed is also reduced, so the amount etched from the etching compensated region θ may be reduced. When the electrical conductivity of the electrical field is reduced, impedance is increased, so the strength of the applied electrical field is increased. Accordingly, the amount of plasma formed is also increased, so the amount etched from the etching compensated region θ may be increased.

The plurality of openings 31 and 32 of the gas exhaust plate 30 may be used as an exhaust opening allowing the process gas, the plasma, and by-products or the like generated during plasma treatment to escape to the gas exhaust passage 90. Moreover, a cross-section of the plurality of openings 31 and 32 may be adjusted to change an upper surface area of the gas exhaust plate 30, so it may be used to control a ground path communicating with the lower electrode 20. In FIG. 1, a first ground path RFRP1, grounded to the lower electrode 20 through the sidewall 11 of the process chamber 10, is illustrated. Moreover, in FIG. 1, a second ground path RFRP2, grounded to the lower electrode 20 through the plasma P and the gas exhaust plate 30, is also illustrated.

The first ground path RFRP1 and the second ground path RFRP2 may be adjusted by adjusting the surface area of the gas exhaust plate 30. Thus, the distribution of the electrical field, applied to the wafer W1, may be controlled, and the etching dispersion of the wafer may be reduced and etching nonuniformity may be mitigated or reduced. According to an embodiment, a stepped portion 33A may be formed in the connection portion 33 to increase an area in contact with the sidewall 11, increasing the available surface area of the gas exhaust plate 30.

In addition, as illustrated in FIGS. 3A-3C, the shape of the adjacent opening 32 may be such that a cross-section of a lower portion 32B is wider than a cross-section of an upper portion 32A. This configuration may allow an amount of the process gas exhausted through the adjacent opening 32 to be increased. FIG. 3A illustrates an example embodiment in which the upper portion 32A of the adjacent opening 32 is formed to have a uniform cross-section, and the lower portion 32B is formed to have a gradually increased cross-section. FIG. 3B illustrates an example in which an inclined surface is formed to allow a cross-section to be gradually increased from an upper portion 1132A to a lower portion 1132B. FIG. 3C illustrates a modified example in which a step is formed in an adjacent opening 2132 to allow a cross-section of the lower portion 2132B to be wider than a cross-section of an upper portion 2132A.

The flow of a process gas has a proportional relationship as shown in Equation 1 below. Here, the flow C of the process gas may be calculated by adjusting a factor A related to an area through which the process gas passes. Thus, a cross-section of the upper portion 32A of the adjacent opening 32 and a cross-section of the lower portion 32B are adjusted, so the flow of a process gas may be controlled.

$$C(\text{Conductance}) \propto \left(\frac{T}{M}\right)^{1/2} \cdot A \cdot Pr \quad \text{[Equation 1]}$$

Figure 4:
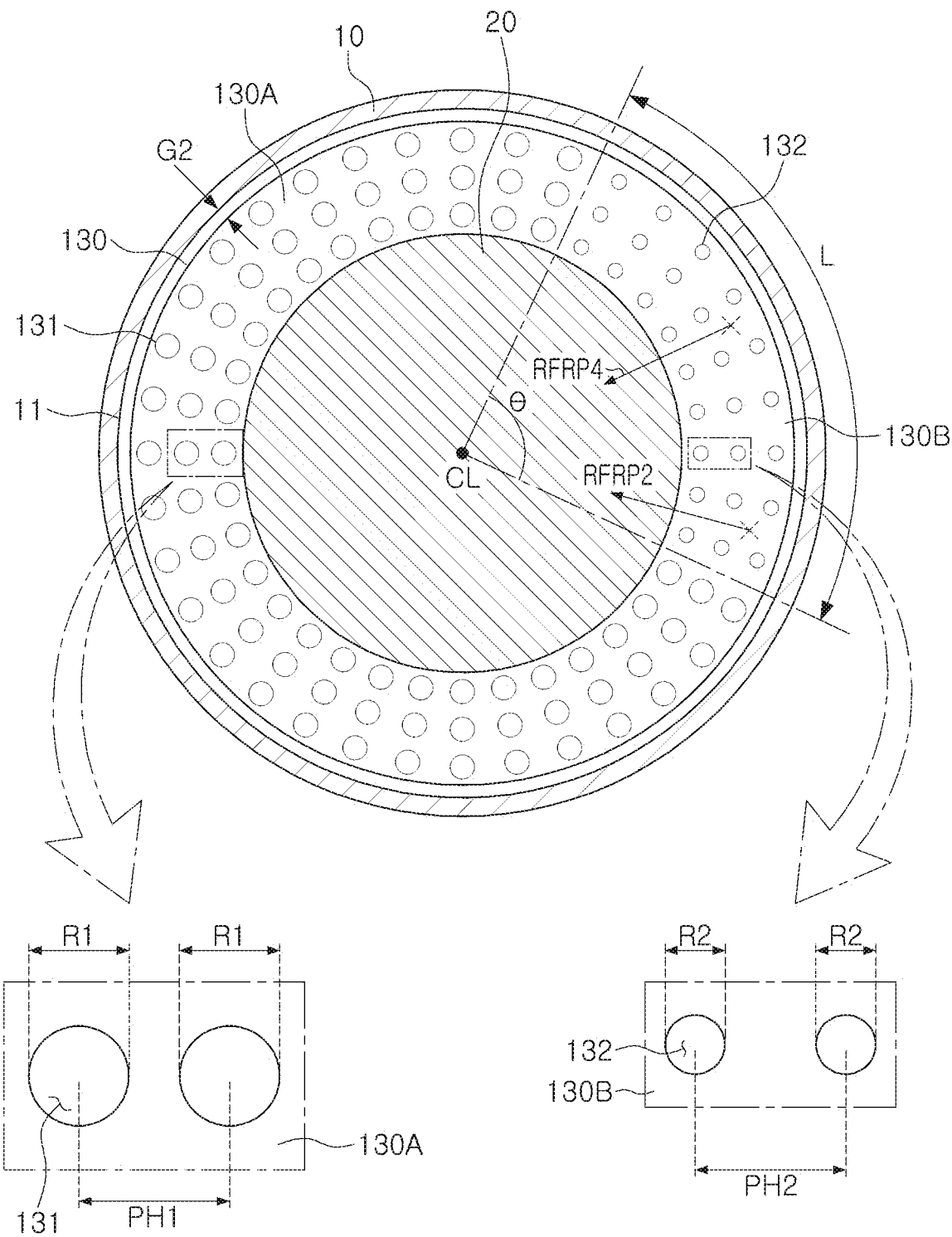
FIG. 4 is a plan view of a plasma processing device according to an embodiment of the present disclosure.

$T$: Temperature of process gas $M$: Molecular weight of process gas $A$: Area through which process gas passes $Pr$: Probability of passing of process gas FIG. 4 illustrates a method of increasing and reducing electrical conductivity by adjusting a size of a cross-section of an adjacent opening 132, adjacent to an etching compensated region θ. In the gas exhaust plate 130 according to an embodiment, a gap G2 with a predetermined distance is formed between the gas exhaust plate and the sidewall 11, so the gas exhaust plate 130 is not in contact with the sidewall 11. However, an embodiment is not limited thereto, and the gas exhaust plate 130 and the sidewall 11 may be in contact with each other.

As described previously, the gas exhaust plate 130 may be electrically connected to the lower electrode 20 to form a ground path. Accordingly changing the shape of the gas exhaust plate 130 may allow control over the distribution of the electrical field applied to the wafer W1. The power applied to the process gas to form the plasma may be applied through the use of high frequency energy. In this case, due to the skin effect, a current, applied through a gas exhaust plate, may flow in a limited manner only through the surface of the gas exhaust plate 130. Plasma may be formed in an upper portion of the gas exhaust plate 130, as the current mainly flows along a fourth ground path RERP4 at the upper surface of the gas exhaust plate. Thus, impedance of an electrical field, flowing in the gas exhaust plate 130, may be determined by an area of the upper surface of the gas exhaust plate 130.

In an embodiment, an area of an upper surface of the second region 130B, of the gas exhaust plate 130, is increased and reduced, so electrical conductivity of the second region 130B may be increased and reduced. As a diameter R2 of the adjacent opening 132 of the second region 130B is formed to be smaller than a diameter R1 of the opening 131 of the first region 130A, an area of an upper surface of the gas exhaust plate 130 may be increased and reduced. Accordingly, impedance at a surface of the gas exhaust plate 130 is reduced, so strength of an applied electrical field is reduced. Meanwhile, an amount of formation of plasma is also reduced, so an etching amount of the etching compensated region θ may be reduced. In this case, each of an interval PH2 between adjacent openings 132 of the second region 130B and an interval PH1 between openings 131 of the first region 130A remains the same. Thus, an area of an upper surface of the second region 130B may be allowed to be wider than an area of an upper surface of the first region 130A.

Figure 5:
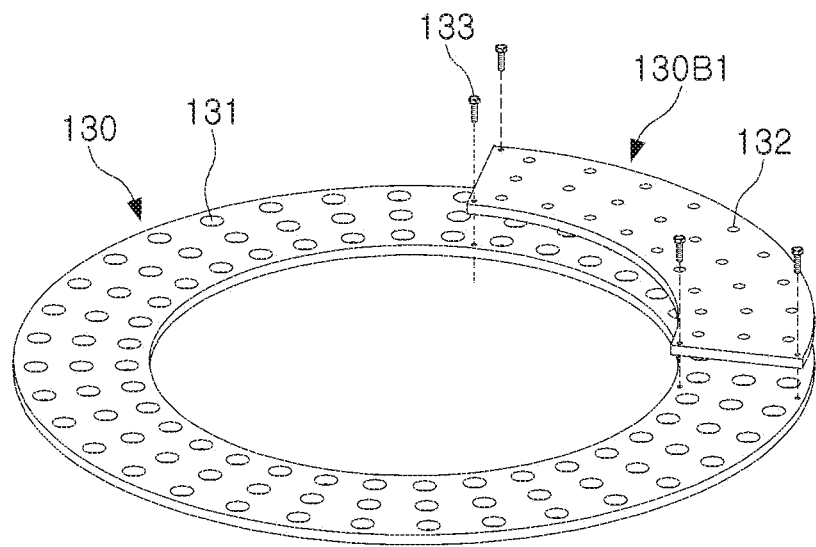
FIGS. 5 and 6 illustrate a modified example of a gas exhaust plate of FIG. 4
Figure 6:
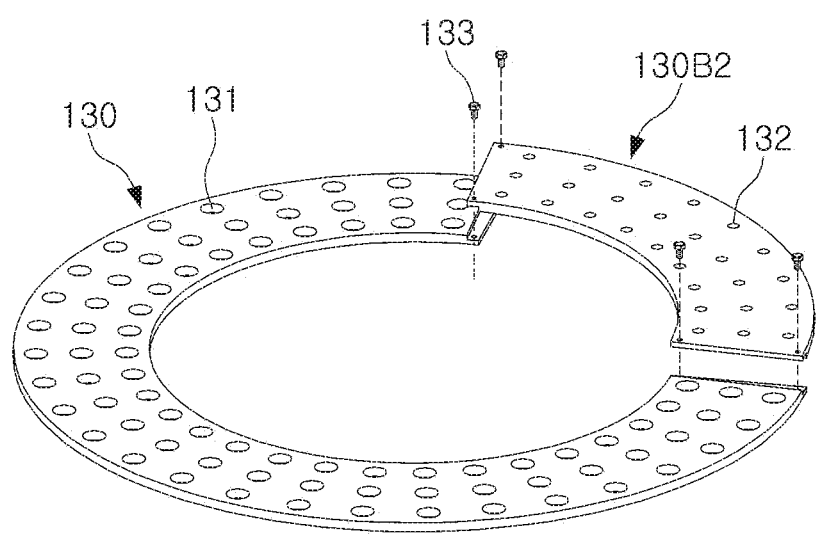

As illustrated in FIGS. 5 and 6, the second region 130B1 and 130B2 may be a modular replacement section of the gas exhaust plate 130, replacing a section of the gas plate 130 designed to be removed and replaced. The modular sections may be held together mechanically by an interlocking mechanism, like a tongue and groove or dovetail, or by an interlocker 133 like a pin, screw, or clamp. The gas exhaust plate 130 may also be modular, allowing for different plates with different structural shapes to replace one another and allowing for different larger or lesser arc length L between the gas exhaust plate 130 and the sidewall 11 of the process chamber (see FIG. 4). The gas plate 130 may be held connected to the lower electrode 20 by adhesive forces, like electrostatic charge and gravity, or by an interlocker. The gas plate 130 may also be self-standing.

The radius of the gas exhaust plate 130 may also be adjustable, with a section of the gas exhaust plate 130 designed to move the outer circumference of the gas exhaust plate into contact with the sidewall 11 of the process chamber and thus creating the connection portion 133. The radius of the gas exhaust plate 130 may be, for example, adjusted by sliding a portion of the gas exhaust plate 130 away from or towards the lower electrode 20, or by adjusting a folded structure like an unfolding a hinged plate or adjusting a flexible folded architecture.

Next, a method of manufacturing a semiconductor device using a plasma processing device according to an embodiment of the present disclosure will be described.

The method of manufacturing a semiconductor device according to an embodiment may include preparing etched mapping data by measuring dispersion of an etching amount of a wafer for a test, etched for a test in a plasma processing device, determining an error region in which the etching amount is outside of a reference value, based on the measured etched mapping data, compensating electrical conductivity of the error region, and compensating flow of a process gas. The wafer may be a semiconductor substrate including an etching layer, and dispersion of an etching amount may be dispersion of an etching amount of the etching layer.

Figure 7:
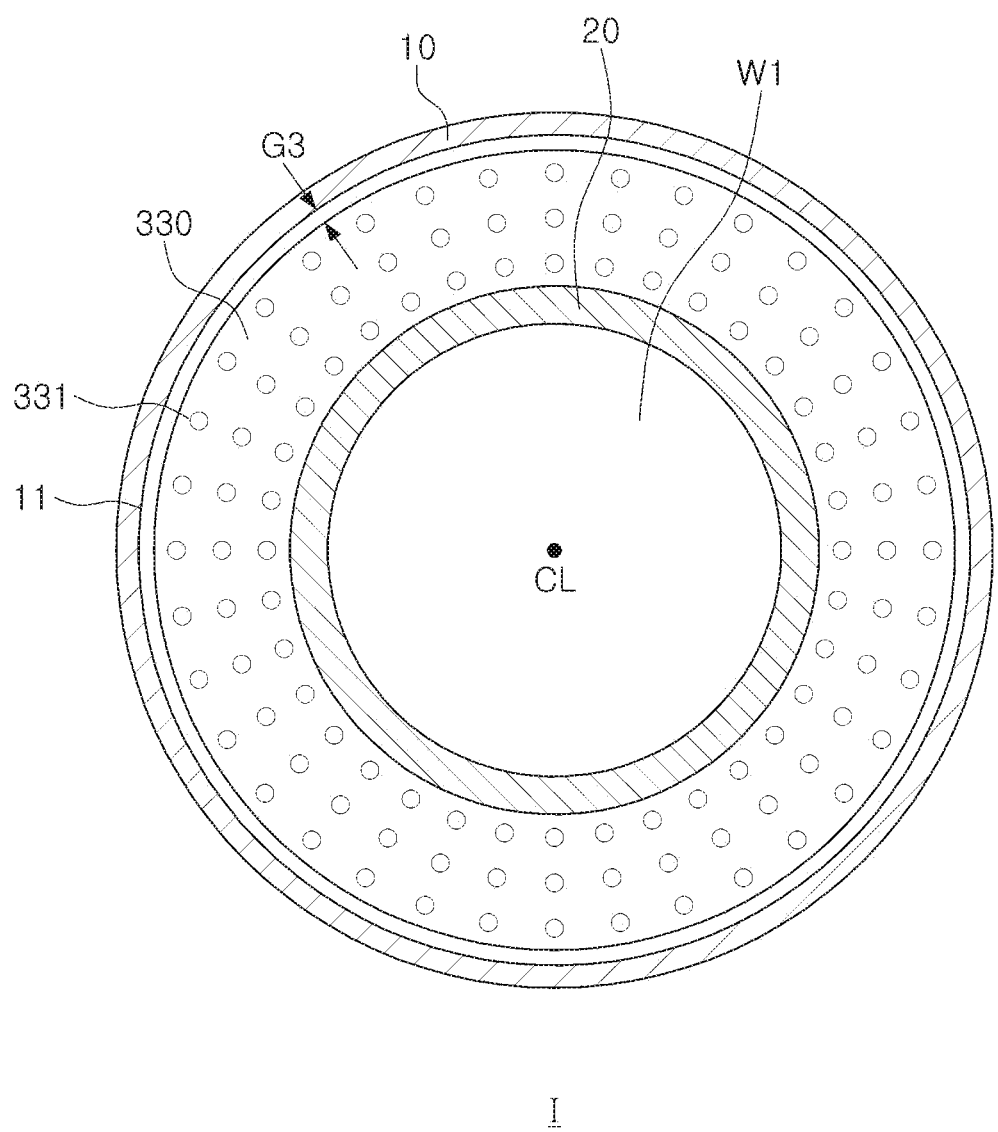
FIGS. 7 to 11 are views illustrating a method of manufacturing a semiconductor device using a plasma processing device according to an embodiment of the present disclosure.

First, as illustrated in FIG. 1, a wafer W1 for a test provided for an etching test (hereinafter "test wafer W1") is inserted into a process chamber 10 of a plasma processing device 1 to perform an etching process, and dispersion of an etching amount of the test wafer W1 subjected to the etching process is measured to prepare etched mapping data. A gas exhaust plate, employed for the etching test, as illustrated in FIG. 7, may be provided with a gap G3 with a predetermined distance between the gas exhaust plate and a sidewall 11, so that the gas exhaust plate 330 and the sidewall 11 may not be in contact with each other, and a plurality of openings 331 of the gas exhaust plate 330 may be formed to have different sizes.

The etching test may be performed one time, but a plurality of test wafers W1 may be prepared to perform the etching test several times and a value, in measured data is averaged, may be used as etched mapping data.

The test wafer W1 is provided for checking the nonuniformity of the etching amount, generated by the plasma processing device 1, and may be used as a target for the etching process of the plasma processing device 1.

Figure 8:
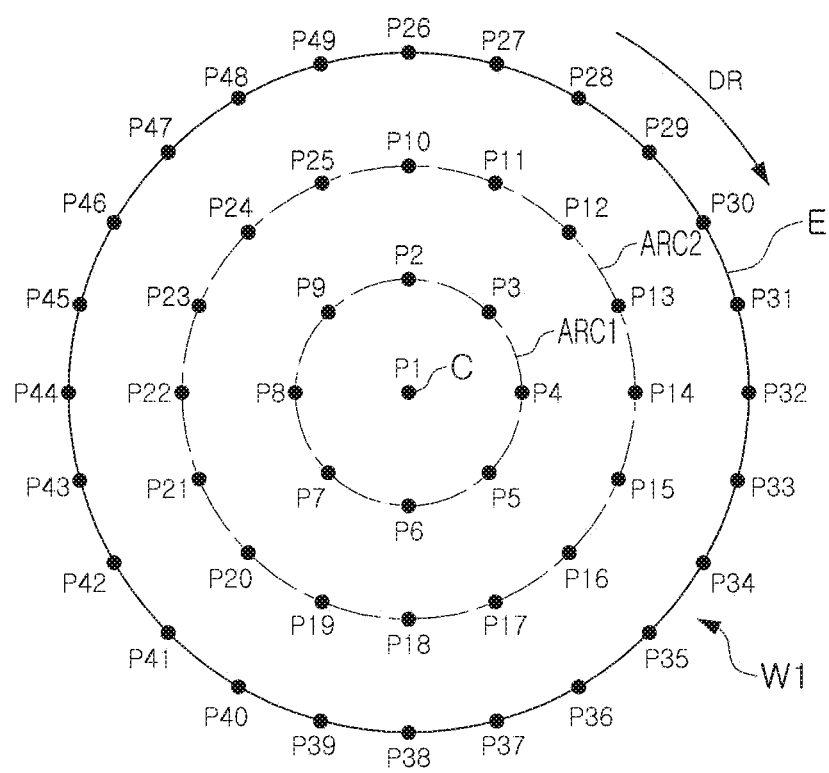

FIG. 8 is a view illustrating a measuring point in which an etching amount of the test wafer W1 after an etching test is measured. In an embodiment, the case is described by way of example, in which measuring points of the test wafer W1 are to be spaced equally apart from each other at equal intervals in a direction DR at the center C, and a plurality of circumferences ARC1, ARC2, and E. The center C is the same position as that of the concentric axis CL, and the plurality of circumferences ARC1, ARC2, and E are at intervals of D1, D2, and D3. That is, in an embodiment, other than a measuring point P1 at the center C, measuring points P2 to P9, P10 to P25, and P26 to P49 may be on the circumferences ARC1, ARC2, and E in a unit of group. However, in some embodiments, the arrangement of the measuring points may be changed as necessary.

Next, based on the etched mapping data, an error region, in which an etching amount of the wafer W1 is outside of a reference value, may be determined.

Figure 9:
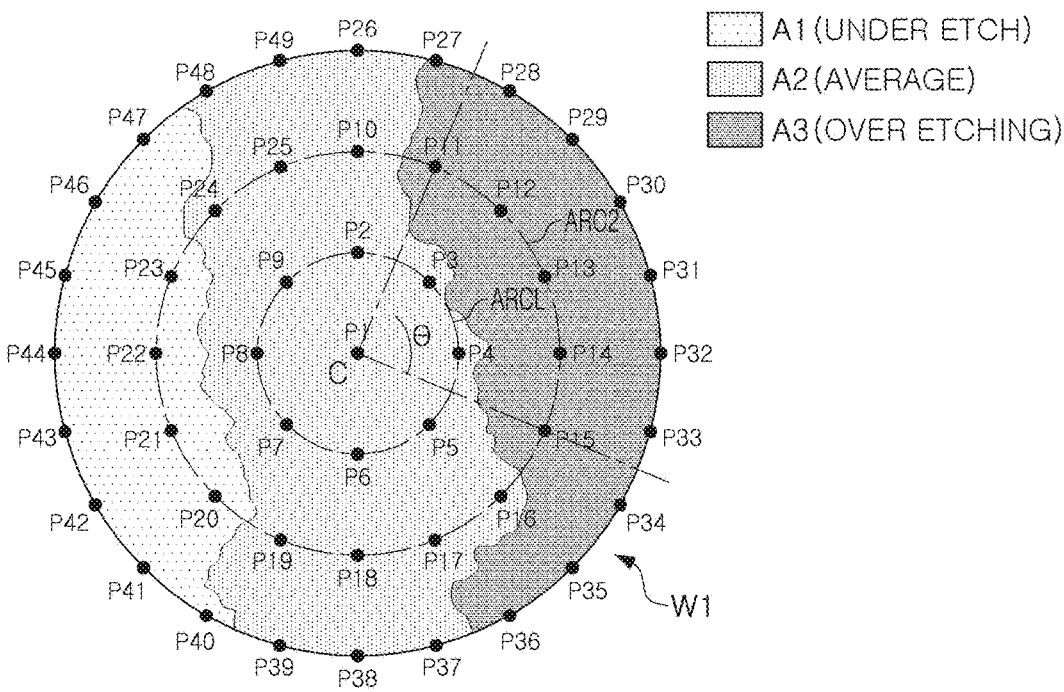
Figure 10:
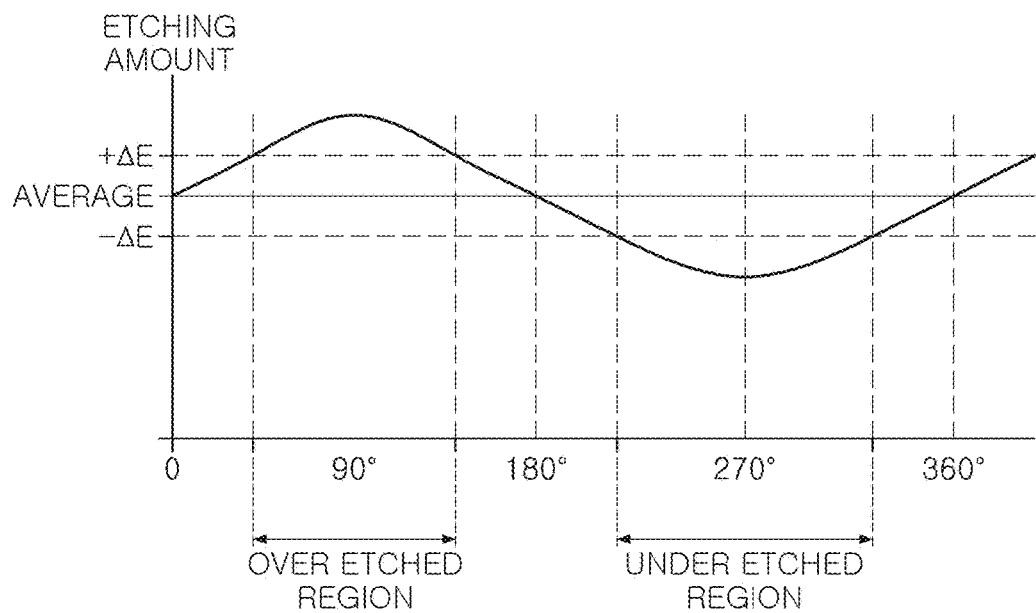

FIG. 9 illustrates etched mapping data created based on a value measured at a measuring point. In the illustrated example, the etched mapping data confirmed that there is dispersion of the etched amount of the test wafer W1. In the illustrated embodiment, under etching occurs in region A1; region A2 is etched with an average value satisfying a reference value; and over etching occurs in region A3.

Based on the etched mapping data, an 'error region' in which an etching amount of the test wafer W1 is outside of a reference value may be determined. In an example embodiment, the reference value of an etching amount is defined in a predetermined range ($-\Delta E$ to $+\Delta E$) from an average value of an etching amount. In an error region, the case in which an etching amount is less than the reference value ($-\Delta E$), the error region is defined as an 'under etched region', and the case in which an etching amount exceeds a reference value ($+\Delta E$), the error region is defined as an 'over etched region'. The etching nonuniformity of the test wafer W1, described above, may be mitigated through compensation of an etching amount to reduce an etching amount of the over etched region and to increase an etching amount of the under etched region. In an example embodiment, the case is described by way of example in which an etching amount of the over etched region is reduced to solve etching nonuniformity of the wafer W1. In an embodiment, measuring points of the wafer W1 are P10 to P25. Here, regions P11 to P15, over etched regions, are determined as an 'etching compensated region.'

The etching nonuniformity, described above, may be generated by various factors. The nonuniformity of an electrical field and nonuniformity of flow of a process gas are two factors having a major impact on etching nonuniformity. These two factors can be adjusted without significantly changing an existing process, compared with other factors, and the nonuniformity of an electrical field and the nonuniformity of flow of a process gas are compensated, thereby efficiently mitigating etching nonuniformity. The nonuniformity of the electrical field and the nonuniformity of flow of a process gas may be compensated at the same time or sequentially.

Then, before a non-test wafer is produced in the plasma processing device 1, compensating of nonuniformity of an applied electrical field may be performed. The nonuniformity of an electrical field may occur according to distribution of electrical conductivity between the upper electrode 40 and the lower electrode 20. In an embodiment, distribution of electrical conductivity of an etching compensated region θ of an error region is adjusted, so the nonuniformity of an electrical field may be solved.

The nonuniformity of an electrical field may be compensated, by adjusting a region in which the gas exhaust plate 30 and the sidewall 11 of the process chamber 10 are in contact with each other, or adjusting a size of a cross-section of an opening 31 adjacent to the etching compensated region θ.

A method of increasing and reducing electrical conductivity of an etching compensated region θ of an error region by adjusting a region in which the gas exhaust plate 30 and the sidewall 11 of the process chamber 10 are in contact with each other will be described. When the gas exhaust plate 30 and the sidewall 11 of the process chamber 10 are in contact with each other, a third ground path RFRP3, in which the sidewall 11 of the process chamber 10 and the lower electrode 20 are connected through the gas exhaust plate 30, may be provided. In an example embodiment, the electrical conductivity of an etching compensated region θ is increased, by forming the third ground path RFRP3 in the second region 30B adjacent to the etching compensated region θ of the gas exhaust plate 30. The third ground path RFRP3 may be formed by replacing a conventional gas exhaust plate by preparing the gas exhaust plate 30 having the connection portion 33 protruding to allow the second region 30B, adjacent to the etching compensated region θ, to be in contact with the sidewall 11 of the process chamber 10. A degree of increasing electrical conductivity is adjusted according to a length L of the connection portion 33. Thus, the arc L of the connection portion 33 may be determined in consideration of a value of electrical conductivity to be increased.

As described above, when the connection portion 33 is formed in the gas exhaust plate 30 and an etching process is performed, in addition to the second ground path RFRP2, a conventional ground path, a third ground path RFRP3 may be added. Thus, a ground path is added to the etching compensated region θ, so electrical conductivity may be increased. When the electrical conductivity is increased, impedance is reduced to reduce strength of an applied electrical field. Accordingly, an amount of formation of plasma is reduced, so an etching amount of an etching compensated region may be reduced.

Next, compensating of exhaust distribution of a process gas, changed in the compensating of distribution of an electrical field, may be performed. In a previous operation, electrical conductivity of the etching compensated region θ is adjusted, so nonuniformity of an electrical field is solved. However, a region in which the gas exhaust plate 30 and the sidewall 11 of a process chamber are in contact with each other is added, so distribution of a process gas exhausted through a gap G1 between the gas exhaust plate 30 and the sidewall 11 of the process chamber may be changed. In a previous operation, when the connection portion 33 is added to the etching compensated region θ, an area of the gap G1 is reduced. Thus, a rate of flow of a process gas of the etching compensated region θ may be reduced, and exhaust distribution of the process gas may be also changed. The reduced rate of flow of a process gas of the etching compensated region θ is increased, so the changed exhaust distribution of a process gas may be compensated.

Figure 11:
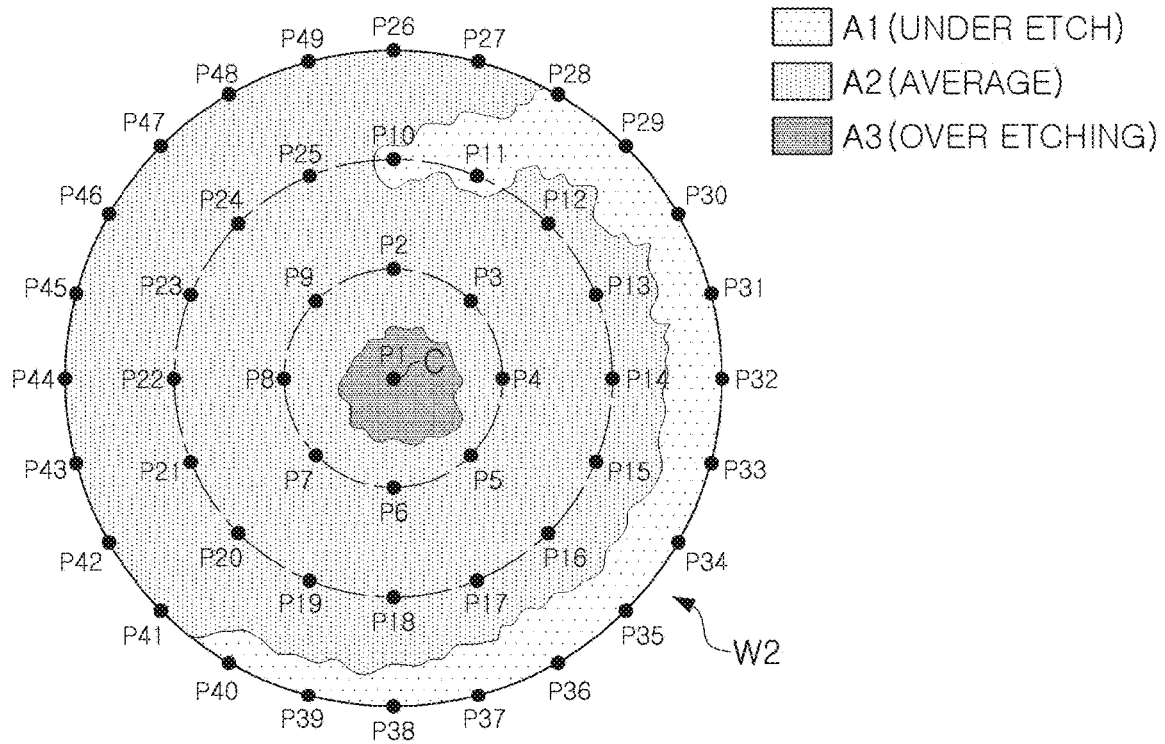

FIG. 11 is a view illustrating dispersion of an etching amount of a wafer W2 on which the gas exhaust plate 30 of FIG. 2 is mounted and which is produced through an etching process. As compared with dispersion of an etching amount measured at the wafer W1 illustrated in FIG. 4, it is confirmed that an etching amount of regions P10 to P25 is uniform.

Figure 12:
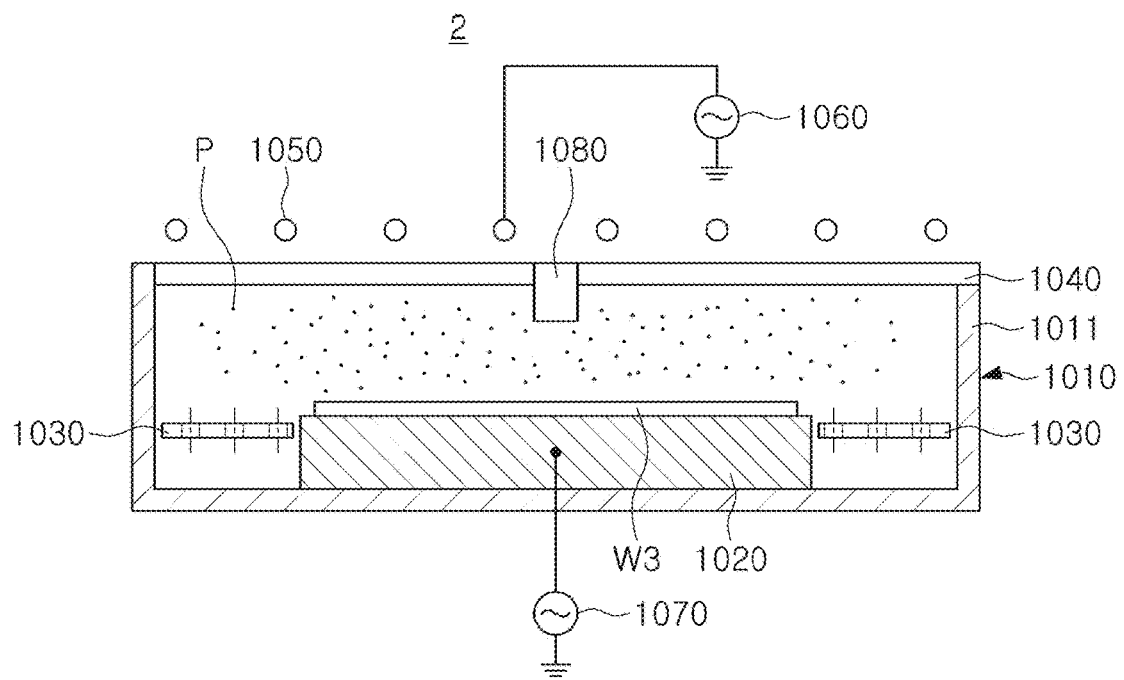
FIG. 12 is a side view of a plasma processing device according to an embodiment of the present disclosure.

FIG. 12 illustrates an example of a plasma processing device used in a method of manufacturing a semiconductor device according to an embodiment. Elements shared between the device illustrated in FIG. 12 and FIG. 1 will not be illustrated, and accordingly, a description of the same constituent elements will be omitted.

A plasma processing device 2 includes a process chamber 1010, a window plate 1040 located in an upper portion of the process chamber 1010, an ICP antenna 1050, and may include a supporting portion 1020 opposite the window plate 1040. The window plate 1040 is in an upper portion of the process chamber 1010, and covers a portion other than a nozzle 1080 to seal the process chamber 1010.

An ICP antenna 1050 may receive power from a first power source 1060, the supporting portion 1020 may receive power from a second power source 1070, and the ICP antenna 1050 may be synchronized with the supporting portion 1020 to form an electrical field. A process gas, supplied to an interior of the process chamber 1010, is excited to plasma through the electrical field, thereby etching a wafer W3.

Although not illustrated, the plasma processing device 1 may further include a controller and a memory connected through a bus. The memory may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The controller may be, a central processing unit (CPU), a processor, an application-specific integrated circuit (ASIC), or another suitable hardware processing unit, that when, executing instructions stored in the memory, configures the controller as a special purpose controller for controlling the plasma processing device 1 FIGS. 1-7.

While example embodiments have been shown and described above, it will be apparent to those skilled in the art that modifications and variations could be made without departing from the scope of the present disclosure, as defined by the appended claims.

What is claimed is:

1. A method of manufacturing a semiconductor device comprising:
   placing a test wafer on a lower electrode inside a process chamber, the lower electrode encircled by a gas exhaust plate, the gas exhaust plate having a plurality of openings;
   etching the test wafer in the process chamber by applying an electrical field to a process gas to produce plasma;
   preparing etched mapping data by measuring an etched amount from the test wafer;
   determining an error region in which the etched amount of the test wafer is outside of a reference value, the reference value being based on the etched mapping data;
   adjusting at least one of an upper cross-section of at least one of the plurality of openings, an upper cross-section of at least one of the plurality of openings in a region adjacent to the error region, and an upper cross-section of at least one of the plurality of openings of a region in which the gas exhaust plate is in contact with a sidewall of the process chamber; and
   adjusting a size of a lower cross-section of at least one of the plurality of openings.

2. The method of manufacturing a semiconductor device of claim 1, wherein the adjusting the upper cross-section of the at least one of the plurality of openings comprises,
   reducing the upper cross-section of the at least one of the plurality of openings to increase electrical conductivity of the error region, or
   increasing the upper cross-section of the at least one of the plurality of openings to reduce electrical conductivity of the error region.

3. The method of manufacturing a semiconductor device of claim 1, wherein the adjusting the upper cross-section of the at least one of the plurality of openings of the region in which the gas exhaust plate is connected to the sidewall comprises,
   increasing the upper cross-section of at least one of the plurality of openings of the region in which the gas exhaust plate is connected to the sidewall of the process chamber to increase electrical conductivity of the error region, or
   reducing the upper cross-section of at least one of the plurality of openings of the region in which the gas exhaust plate is connected to the sidewall of the process chamber to reduce electrical conductivity of the error region.

4. The method of manufacturing a semiconductor device of claim 2, wherein the adjusting the size of the lower cross-section of the at least one of the plurality of openings comprises,
   adjusting the size of the lower cross-section of the at least one of the plurality of adjusting the size of the lower cross-section of the at least one of the plurality of openings to be larger than the upper cross-section of the plurality of openings to increase an amount of the process gas exhausted through the at least one of the plurality of openings, or
   adjusting the size of the lower cross-section of the at least one of the plurality of openings to be smaller than the upper cross-section of the plurality of openings to reduce the amount of the process gas exhausted through the at least one opening.

5. The method of manufacturing a semiconductor device of claim 4, wherein when an electrical conductivity of the error region is increased an amount of the process gas is increased.

6. The method of manufacturing a semiconductor device of claim 4, wherein when an electrical conductivity of the error region is reduced an amount of the process gas is reduced.

7. The method of manufacturing a semiconductor device of claim 1, wherein the reference value is an average value of the etched amount of the test wafer.

8. The method of manufacturing a semiconductor device of claim 1, wherein the etched mapping data is comprised of values of the etched amount of the test wafer measured at equal intervals in a circumferential direction from a center of the test wafer.

9. A method of manufacturing a semiconductor device, comprising:
 etching a test wafer by applying an electrical field to a process gas to produce plasma in a process chamber;
 regulating the plasma by venting the process gas through a gas exhaust plate, the gas exhaust plate having a plurality of openings connected to a gas exhaust passage;
 preparing etched mapping data by measuring etched amounts of the test wafer;
 determining an error region in which an etching amount of the test wafer is outside of a reference value, the reference value being based on the etched mapping data;
 increasing or reducing an electrical conductivity of the electrical field, applied to the error region, by at least adjusting a size of an upper cross-section of at least one of an adjacent plurality of openings in a region adjacent to the error region, adjusting a size of an upper cross-section of the plurality of openings, and adjusting a size of an upper cross-section of a plurality of openings of a region connected to a sidewall of the process chamber; and
 changing an exhaust distribution of the process gas exhausted through the gas exhaust passage by adjusting a size of a lower cross-section of an adjacent opening.

10. The method of manufacturing a semiconductor device of claim 9, wherein the electrical conductivity of the electrical field is determined by impedance to a ground path connected to a lower electrode through the gas exhaust plate.

11. The method of manufacturing a semiconductor device of claim 10, wherein the increasing or reducing electrical conductivity of the electrical field reduces or increases the impedance.

12. The method of manufacturing a semiconductor device of claim 9, wherein the increasing or reducing electrical conductivity of the electrical field comprises,
 reducing the size of the upper cross-section of the at least one of the plurality of openings to increase the electrical conductivity of the error region, or
 increasing the size of the upper cross-section of the at least one of the plurality of openings to reduce the electrical conductivity of the error region.

13. The method of manufacturing a semiconductor device of claim 9, wherein the increasing or reducing electrical conductivity of the electrical field comprises,
 increasing the size of an upper cross-section of at least one of the plurality of openings of the region in which the gas exhaust plate is connected to the sidewall of the process chamber to increase the electrical conductivity of the error region, or
 reducing the size of an upper cross-section of at least one of the plurality of openings of the region in which the gas exhaust plate is connected to the sidewall of the process chamber to reduce the electrical conductivity of the error region.

14. The method of manufacturing a semiconductor device of claim 9, wherein the changing the exhaust distribution of a process gas comprises,
 adjusting the size of the lower cross-section of the at least one of the plurality of openings to be larger than the size of the upper cross-section of the plurality of openings to increase an amount of the process gas exhausted through the at least one of the plurality of openings, or
 adjusting the size of the lower cross-section of the at least one of the plurality of adjusting the size of the lower cross-section of the at least one of the plurality of openings to be smaller than the size of the upper cross-section of the plurality of openings to reduce the amount of process gas exhausted through the at least one opening.

15. The method of manufacturing a semiconductor device of claim 9, wherein the etched mapping data is a value in which an etched amount of the test wafer is measured at equal intervals in a circumferential direction of the test wafer from a center of the test wafer.

16. A plasma processing device, comprising:
 a process chamber having a sidewall;
 an upper electrode in an upper portion of the process chamber;
 a lower electrode in a lower portion of the process chamber, the lower electrode having a mounting region on which to mount a wafer;
 a gas exhaust passage between the sidewall and the lower electrode, the gas exhaust passage configured to exhaust a process gas; and
 a gas exhaust plate encircling the lower electrode and having a plurality of openings connected to the gas exhaust passage,
 wherein the plasma processing device includes a gap between the sidewall of the process chamber and the gas exhaust plate, and
 the gas exhaust plate includes a plurality of modular sections, each configured to hold a modular replacement section, such that the gas exhaust plate is configured to be adjustable.

17. The plasma processing device of claim 16, wherein the mounting region forms a ground path between the lower electrode and the upper electrode.

18. The plasma processing device of claim 16, wherein the gas exhaust plate has an upper surface area greater than a lower surface area.

19. The plasma processing device of claim 16, wherein at least one opening of the plurality of openings in a region of the gas exhaust plate adjacent to the mounting region is provided with a size of an upper cross-section of the plurality of openings, the size of the upper cross-section of the plurality of openings being less than a size of a lower cross-section of the plurality of openings.

20. The plasma processing device of claim 16, wherein at least one region of a perimeter of the gas exhaust plate, through one of the modular replacement sections, is selectively in contact with the sidewall of the process chamber.

* * * * *